(12) United States Patent
Park et al.

(10) Patent No.: US 9,192,050 B2
(45) Date of Patent: Nov. 17, 2015

(54) METHOD OF MANUFACTURING PRINTED CIRCUIT BOARD

(71) Applicant: SAMSUNG ELECTRO-MECHANICS CO., LTD., Suwon (KR)

(72) Inventors: Sung Yeol Park, Suwon (KR); Suk Jin Ham, Suwon (KR); Jung Tae Park, Suwon (KR); Seung Heon Han, Suwon (KR); Jung Eun Noh, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 384 days.

(21) Appl. No.: 13/765,650

(22) Filed: Feb. 12, 2013

(65) Prior Publication Data

US 2014/0130347 A1    May 15, 2014

(30) Foreign Application Priority Data

Nov. 15, 2012  (KR) .................... 10-2012-0129689

(51) Int. Cl.
*H05K 3/30*   (2006.01)
*H05K 1/18*   (2006.01)
*H05K 3/46*   (2006.01)

(52) U.S. Cl.
CPC ............. *H05K 1/185* (2013.01); *H05K 3/4644* (2013.01); *H05K 3/4697* (2013.01); *H05K 2201/1053* (2013.01); *H05K 2201/10515* (2013.01); *Y10T 29/4913* (2015.01)

(58) Field of Classification Search
CPC ....... H05K 1/185; H05K 1/186; H05K 1/188; H05K 3/4644; H05K 3/4697; H05K 2201/10515; H05K 2201/1053; Y10T 29/4916; Y10T 29/49124; Y10T 29/49117; Y10T 29/49002; Y10T 29/49146; Y10T 29/49158
USPC .................. 29/832, 829, 825, 592.1, 841, 848
See application file for complete search history.

(56) References Cited

U.S. PATENT DOCUMENTS

| 5,879,964 | A | 3/1999 | Paik et al. | |
|---|---|---|---|---|
| 8,186,046 | B2* | 5/2012 | Tanaka | H01L 23/5389 29/830 |
| 2008/0129443 | A1* | 6/2008 | Tsukada | H01C 7/003 338/309 |
| 2009/0242252 | A1* | 10/2009 | Tanaka | H01L 23/5389 174/260 |
| 2013/0105943 | A1* | 5/2013 | Lai | H01L 23/498 257/532 |

* cited by examiner

*Primary Examiner* — Peter DungBa Vo
*Assistant Examiner* — Azm Parvez
(74) *Attorney, Agent, or Firm* — NSIP Law

(57) ABSTRACT

Disclosed herein is a method of manufacturing a printed circuit board, including; forming an electronic component including an electrode that is formed on at least one side of a body; forming terminals on an upper portion of the electrode and an upper portion of the body; providing a substrate in which a cavity is formed; mounting the electronic component formed with the terminals in the cavity of the substrate; and forming a buildup layer on an upper portion of the substrate and an upper portion of the electronic component.

17 Claims, 9 Drawing Sheets

METHOD OF MANUFACTURING PRINTED CIRCUIT BOARD

CROSS REFERENCE TO RELATED APPLICATION

This application claims the benefit of Korean Patent Application No. 10-2012-0129689, filed on Nov. 15, 2012, entitled "Method of Manufacturing Printed Circuit Board" which is hereby incorporated by reference in its entirety into this application.

BACKGROUND OF THE INVENTION

1. Technical Field

The present invention relates to a method of manufacturing a printed circuit board.

2. Description of the Related Art

Generally, a circuit board may include various active devices and passive devices, such as a resistor, a capacitor, an inductor, a transformer, a filter, a mechanical switch, a relay, and the like. Meanwhile, electronic devices are systematically connected with one another so as to enable each device to perform its original function well, such that when power is applied to circuits, various passive devices or active devices configuring the electronic devices each perform their original functions.

In particular, with a tendency of a market demanding reduction in profile and various functions in a semiconductor package, various technologies for implementing a printed circuit board has been required. Recently, as a part of a next-generation multi-functional and small package technology, the development of an embedded printed circuit board has received attention. The embedded printed circuit board may include electronic components such as passive devices or active devices that are inserted into an inner layer thereof so as to perform their functions therein (U.S. Pat. No. 5,879,964). However, in manufacturing the printed circuit board in which electronic components are embedded, defects of the arrangement of the embedded electronic components and external circuit layers may occur and electrodes may be damaged when vias are formed in the electrodes of electronic components, thereby causing the degradation in reliability.

SUMMARY OF THE INVENTION

The present invention has been made in an effort to provide a method of manufacturing a printed circuit board, in which a buildup layer can be electrically connected with electronic components reliably.

Further, the present invention has been made in an effort to provide a method of manufacturing a printed circuit board capable of preventing electrodes of electronic components from being damaged at the time of electrical connection between a buildup layer and electronic components.

In addition, the present invention has been made in an effort to provide a method of manufacturing a printed circuit board, in which electronic components can be electrically connected with one another.

According to a preferred embodiment of the present invention, there is provided a method of manufacturing a printed circuit board, including: forming an electronic component including an electrode that is formed on at least one of a body; forming terminals on an upper portion of the electrode and an upper portion of the body; providing a substrate in which a cavity is formed; mounting the electronic component formed with the terminals in the cavity of the substrate; and forming a buildup layer on an upper portion of the substrate and an upper portion of the electronic component.

The method of manufacturing a printed circuit board may further include: prior to the forming of the terminals, applying a conductive paste to the upper portion of the electrode of the electronic component and the upper portion of the body of the electronic component.

The terminal may be formed on an upper portion of the conductive paste.

In the forming of the terminals, the terminals may be formed of a conductive paste.

In the forming of the terminals, the terminals may be formed by a plating method.

In the forming of the terminals, external terminals may be bonded to the upper portion of the electrode of the electronic component and the upper portion of the body of the electronic component.

The external terminals may be bonded to the upper portion of the electrode and the upper portion of the body by a welding method or a conductive adhesive.

In the forming of the buildup layer, the buildup layer may include at least one layer of insulating layer and circuit layer.

The buildup layer may further include a via that is connected with an upper portion of the terminal.

According to another preferred embodiment of the present invention, there is provided a method of manufacturing a printed circuit board, including: forming a first electronic component formed with a first electrode on at least one side of a first body and a second electronic component formed with a second electrode on at least one side of a second body; mounting the second electronic component on an upper portion of the first electronic component; forming terminals on an upper portion of the second body and an upper portion of the second electrode and a side of the second electrode and a side of the first electrode; providing a substrate in which a cavity is formed; mounting the first electronic component and the second electronic component formed with the terminals in the cavity of the substrate; and forming a buildup layer on an upper portion of the substrate and an upper portion of the second electronic component.

In the mounting of the second electronic component on the upper portion of the first electronic component, the first electronic component and the second electronic component may be bonded to each other by an adhesive.

The method of manufacturing a printed circuit board may further include: prior to the mounting of the second electronic component on an upper portion of the first electronic component, applying a conductive paste to the upper portion of the second body and the upper portion of the second electrode and the side of the second electrode and the side of the first electrode.

The terminal may be formed on an upper portion of the conductive paste.

In the forming of the terminals, the terminals may be formed of a conductive paste.

In the forming of the terminals, the terminals may be formed by a plating method.

In the forming of the terminals, the terminals may be formed by bonding external terminals to the side of the first electrode, the upper portion of the second body, the upper portion of the second electrode, and the side of the second electrode.

The external terminals may be bonded to the first electrode and the second electrode by a welding method or a conductive adhesive.

In the forming of the buildup layer, the buildup layer may include at least one layer of insulating layer and circuit layer.

The buildup layer may further include a via that is connected with an upper portion of the terminal.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
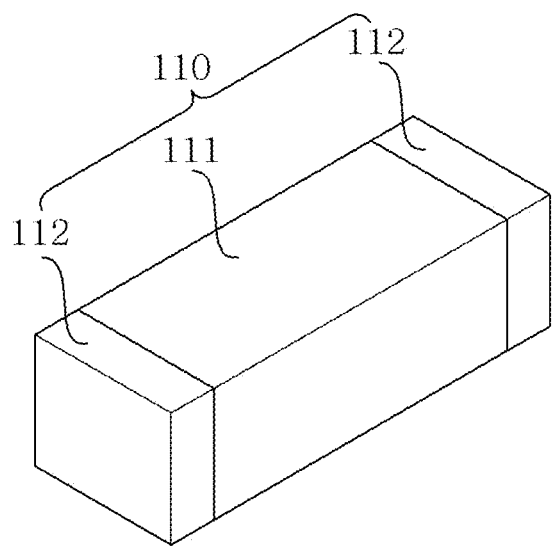
FIGS. 1 to 6 are exemplified diagrams illustrating a method of manufacturing a printed circuit board according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention are described in detail with reference to the accompanying drawings.

Method of Manufacturing Printed Circuit Board According to Preferred Embodiment of the Present Invention FIGS. 1 to 6 are exemplified diagrams illustrating a method of manufacturing a printed circuit board according to a preferred embodiment of the present invention.

Referring to FIG. 1, an electronic component 110 is provided. The electronic component 110 may be a component electrically connected with a substrate 140 to perform a predetermined function. For example, the electronic component 110 may be an active device or a passive device.

At least one side of the electronic component 110 may be formed with an electrode 112. The electrode 112 of the electronic component 110 may be a component that electrically connects between the substrate and the electronic component 110. According to the embodiment of the present invention, the electrode 112 of the electronic component 110 is formed at both sides of a body 111. However, this is only an example and is not limited to the shape of the electronic component 110. A structure of the electrode 112 formed in the electronic component 110 may be easily changed in a design by those skilled in the art.

Figure 2:
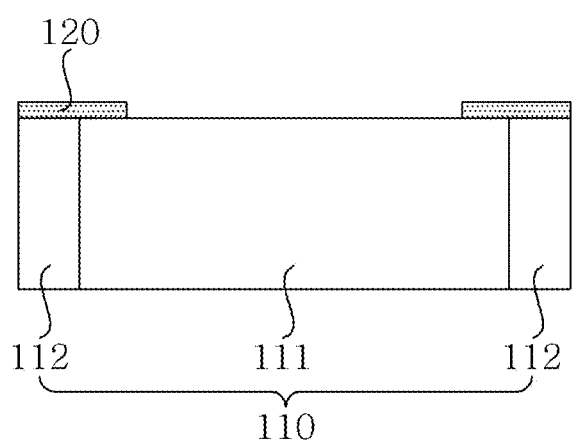

Referring to FIG. 2, a conductive paste 120 may be applied to the electronic component 110. For example, the conductive paste 120 may be applied on an upper portion of the electrode 112 and an upper portion of the body 111 of the electronic component 110. The conductive paste 120 may be formed to improve adhesion reliability between a terminal 130 and the electronic component 110. The applying of the conductive paste 120 of FIG. 2 is to improve the adhesion between the electronic component 110 and the terminal 130 to be formed later, which may be omitted by a selection of those skilled in the art.

Figure 3:
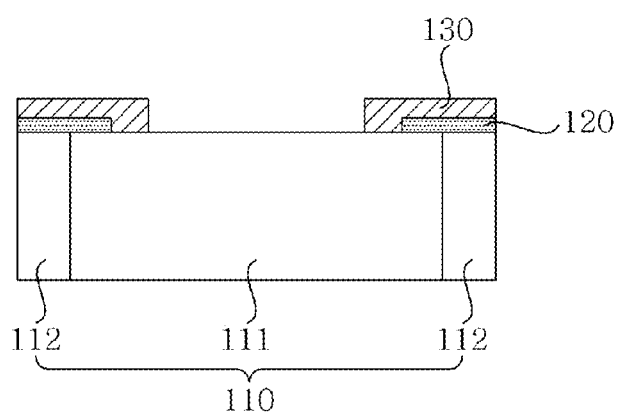

Referring to FIG. 3, the terminal 130 may be formed in the electronic component 110. According to the preferred embodiment of the present invention, the terminals 130 may be formed on the upper portion of the electrode 112 and the upper portion of the body 111. In this case, when the conductive paste 120 is applied on the upper portion of the electrode 112 and the upper portion of the body 111, the terminal 130 may be formed on an upper portion of the conductive paste 120. Alternatively, when the applying of the conductive paste 120 is applied on the upper portion of the electrode 112 and the upper portion of the body 111 is omitted, the terminals 130 may be formed on the upper portion of the electrode 112 and the upper portion of the body 111.

The terminal 130 may be formed of an electro conductive material. For example, the terminals 130 may be formed on the upper portion of the electrode 112 and the upper portion of the body 111 by a plating method. Alternatively, the terminal 130 may be formed by bonding the previously formed external terminals 130 to the upper portion of the electrode 112 and the upper portion of the body 111. In this configuration, the external terminal 130 may be bonded to the electronic component 110 by a welding method or a conductive adhesive. Further, the terminal 130 may be formed of a conductive paste.

Figure 4:
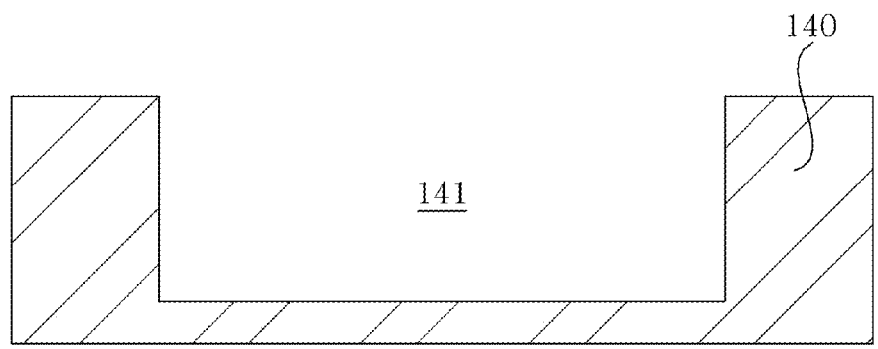

Referring to FIG. 4, a substrate 140 in which a cavity 141 is formed may be provided. The substrate 140 may be formed of an insulating material. As the insulating material, a thermosetting resin such as epoxy resin, a thermoplastic resin such as polyimide, and a resin formed by impregnating reinforcing materials such as a glass fiber, an inorganic filler, and the like in the above resins, are impregnated, for example, a prepreg may be used. Further, the insulating material may be a photocurable resin, and the like, but is not limited thereto. Further, the substrate 140 is not illustrated, but at least one layer of circuit layer may be formed in an insulating material.

The cavity 141 is an area drilled to embed the electronic component 110 in the substrate 140. A method of forming the cavity 141 is not particularly limited. For example, the cavity 141 may be formed by a laser drill.

Figure 5:
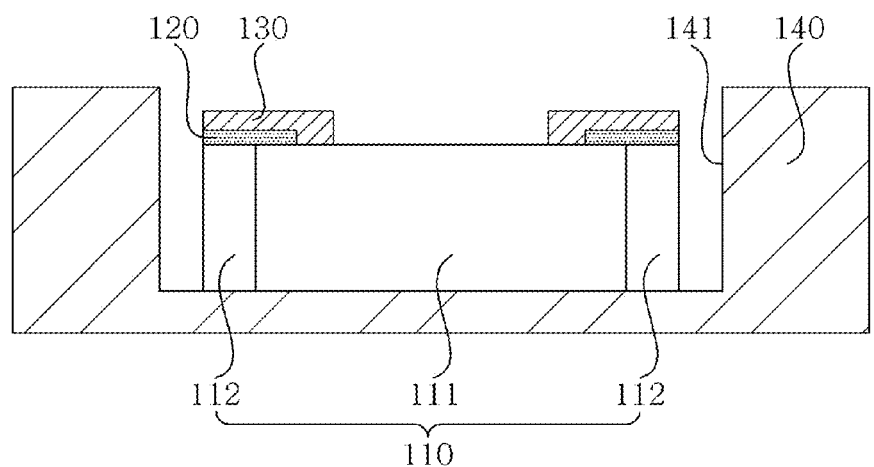

Referring to FIG. 5, the electronic component 110 may be mounted on the substrate 140. The electronic component 110 in which the terminal 130 is formed may be inserted into the cavity 141 of the substrate. In this case, although not illustrated, one surface of the cavity 141 contacting the electronic component 110 may be applied with an adhesive.

Figure 6:
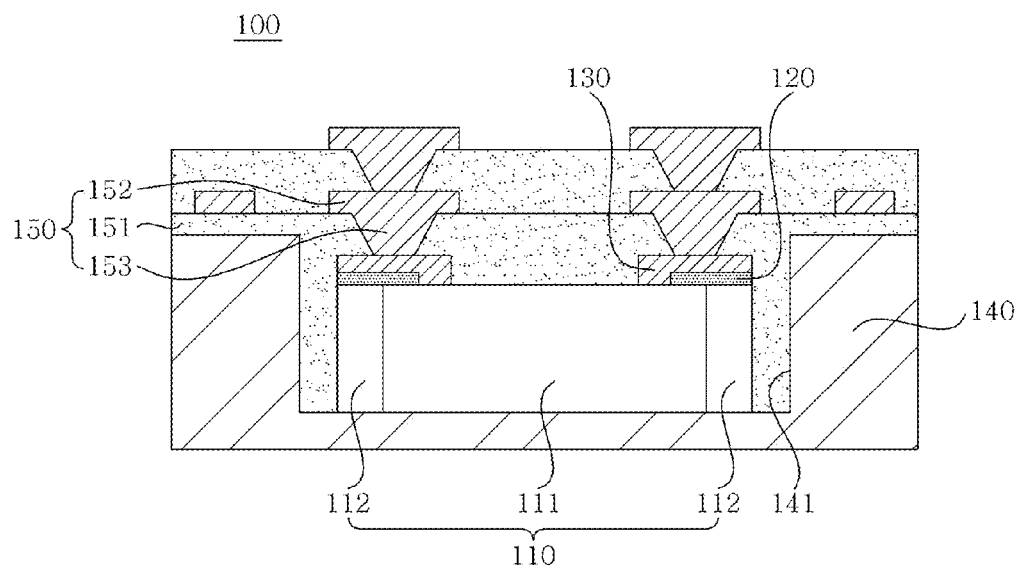

Referring to FIG. 6, the buildup layer 150 may be formed on the upper portion of the substrate 140 and the upper portion of the electronic component 110. The buildup layer 150 is formed on the upper portion of the substrate 140 in which the electronic component 110 is embedded, such that the printed circuit board 100 having the electronic component 110 embedded therein may be formed. Here, the buildup layer 150 may include at least one layer of insulating layer 151 and circuit layer 152. The buildup layer 150 may be electrically connected with the electronic component 110 embedded in the substrate 140. The insulating layer 151 may be formed on the upper portion of the substrate 140 and may also be formed in a space between the electronic component 110 that is located in the cavity 141 and an inner wall of the cavity 141. The circuit layer 152 is connected with the electrode 112 by a via 153, such that the buildup layer 150 may be electrically connected with the electronic component 110. In this case, the terminal 130 is formed over the upper portion of the electrode 112 and the upper portion of the body 111 of the electronic component 110, such that an area contacting the via 153 may be increased. That is, at the time of forming the via 153, an area that can be electrically connected with the electronic component 110 is increased, thereby improving reliability of the electrical connection between the electronic component 110 and the buildup layer 150. Further, the via 153 is formed so as to be connected with an upper surface of the terminal 130 rather than with the electrode 112, thereby preventing the electrode 112 from being damaged that may occur at the time of forming the via 153.

Method of Manufacturing Printed Circuit Board According to Another Preferred Embodiment of the Present Invention FIGS. 7 to 13 are exemplified diagrams illustrating a method of manufacturing a printed circuit board according to another preferred embodiment of the present invention.

Figure 7:
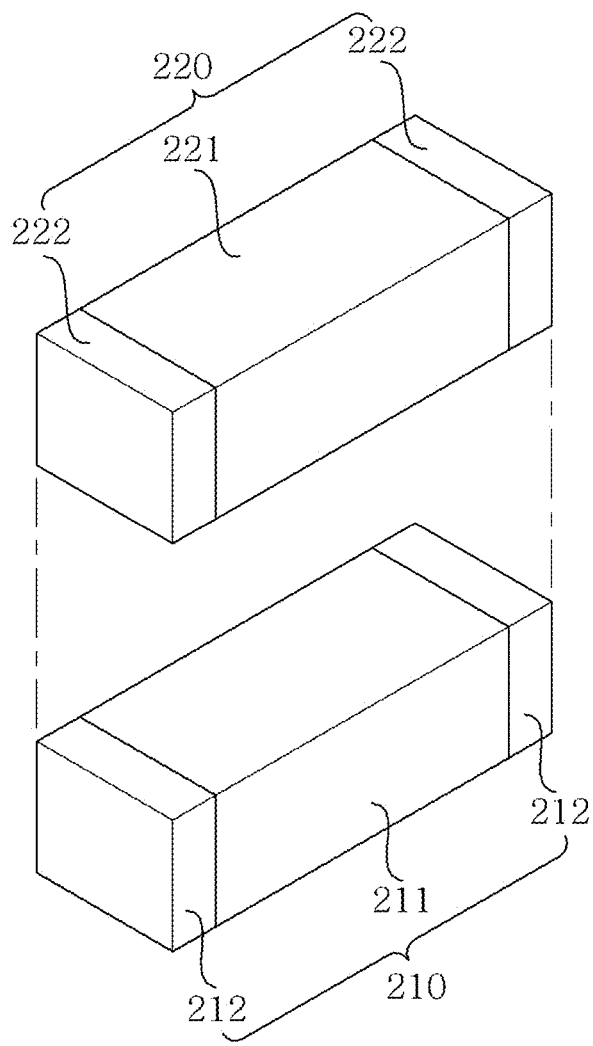
FIGS. 7 to 13 are exemplified diagrams illustrating a method of manufacturing a printed circuit board according to another preferred embodiment of the present invention.

Referring to FIG. 7, a first electronic component 210 and a second electronic component 220 are provided. For example, the first electronic component 210 and the second electronic component 220 may be components that are electrically connected with a substrate 260 to perform a predetermined function, like active devices and passive devices. In the first electronic component 210, a first electrode 212 may be formed on at least one side of the first body 211. Further, in the second electronic component 220, a second electrode 222 may be formed on at least one side of the second body 221. According to the preferred embodiment of the present invention, the first electrode 212 may be formed at both sides of the first body 211. Further, the second electrode 222 may be formed at both sides of the second body 221.

Figure 8:
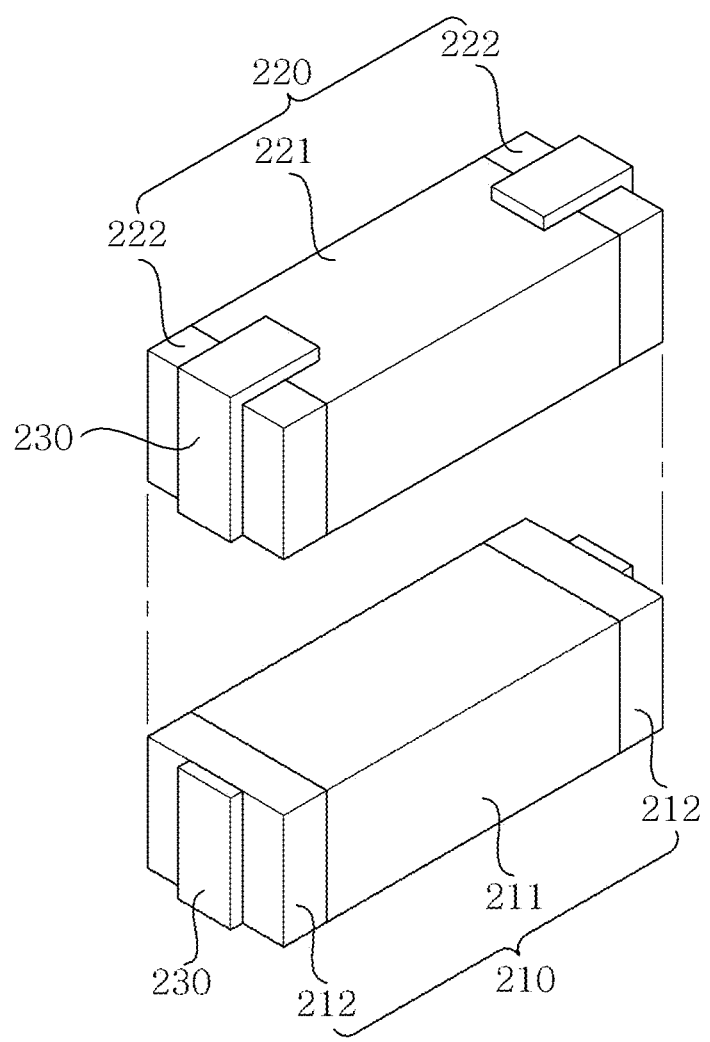

Referring to FIG. 8, a conductive paste 230 may be applied to the first electronic component 210 and the second electronic component 220. The conductive paste 230 may be formed to improve adhesion reliability between a terminal 250 to be formed later and the first electronic component 210 and the second electronic component 220. In the first electronic component 210, the conductive paste 230 may be applied to the side of the first electrode 212. Further, in the second electronic component 220, the conductive paste 230 may be formed on an upper surface of the second electrode 222, a side of the second electrode 222, and an upper surface of the second body 221. The applying of the conductive paste 230 is to improve the adhesion between the first electronic component 210 and the second electronic component 220 and the terminal 250 to be formed later, which may be omitted by a selection of those skilled in the art.

Figure 9:
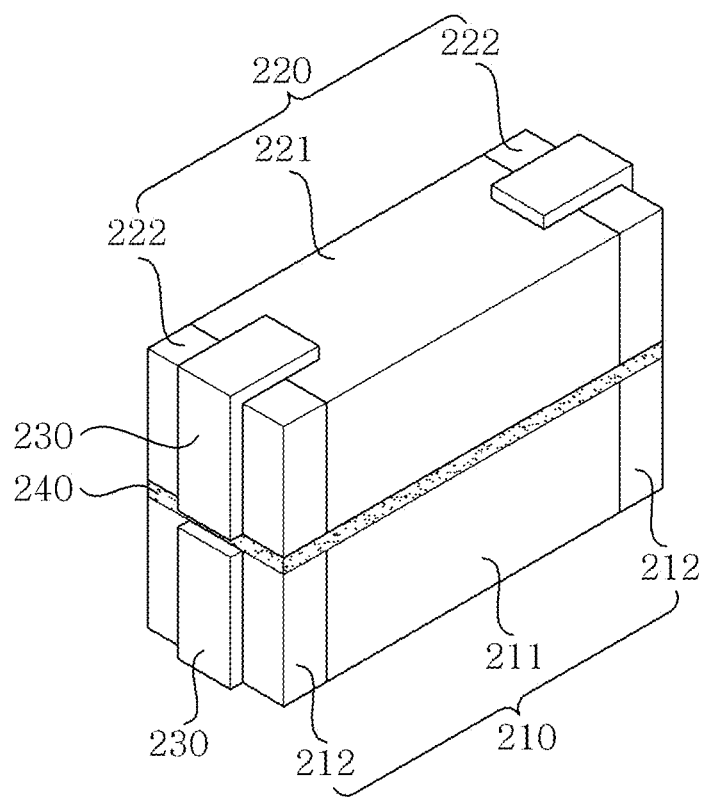

Referring to FIG. 9, the second electronic component 220 may be mounted on an upper portion of the first electronic component 210. In this case, the first electronic component 210 and the second electronic component 220 may be bonded to each other by an adhesive 240. That is, the adhesive 240 is applied to the upper portion of the first electronic component 210 and then, the second electronic component 220 may be mounted thereon. For example, the adhesive 240 may be epoxy resin, and the like.

In the preferred embodiment of the present invention, it is described that the conductive paste 230 is applied to the first electronic component 210 and the second electronic component 220 and then, the second electronic component 220 may be mounted on the upper portion of the first electronic component 210. However, the preferred embodiment of the present invention is not limited thereto, and may be performed in an order of mounting the second electronic component 220 on the upper portion of the first electronic component 210 and then, applying the conductive paste 230 thereon.

Figure 10:
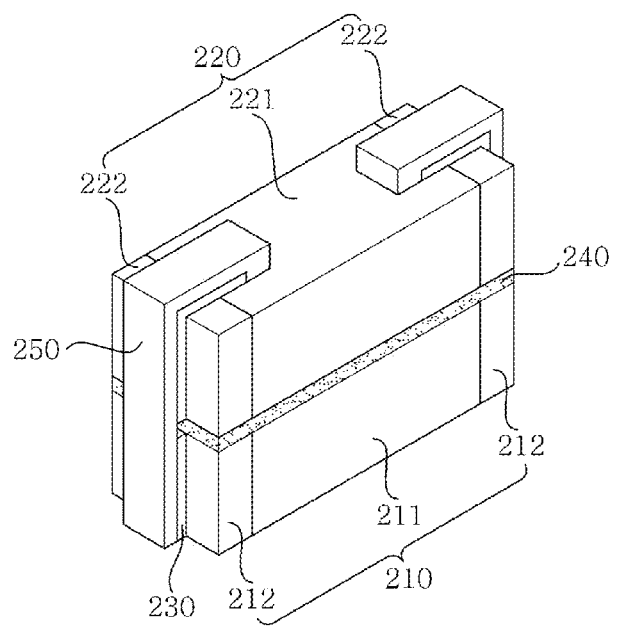

Referring to FIG. 10, the first electronic component 210 and the second electronic component 220 may be formed with the terminal 250. When the conductive paste 230 is applied to the first electronic component 210 and the second electronic component 220, the terminal 250 may be formed on the upper portion of the conductive paste 230. Therefore, the lower portion of the terminal 250 may be formed on the conductive paste 230 that is applied to the side of the first electrode 212. Further, the upper portion of the terminal 250 may be formed on the conductive paste 230 that is applied to the upper surface of the second electrode 222, the side of the second electrode 222, and the upper surface of the second body 221.

When the applying of the conductive paste 230 to the first electronic component 210 and the second electronic component 220 is omitted, the terminal 250 may be formed to directly contact the first electrode 212, the second electrode 222, and the second body 221. In this case, the lower portion of the terminal 250 may be formed on the side of the first electrode 212. Further, the upper portion of the terminal 250 may be formed on the upper surface of the second electrode 222, the side of the second electrode 222, and the upper surface of the second body 221.

The terminal 250 may be formed of an electro conductive material. For example, the terminal 250 may be formed by a plating method. Alternatively, the terminal 250 may be formed by bonding the previously formed external terminal 250 to the first electronic component 210 and the second electronic component 220. In this configuration, the external terminals 250 may be bonded to the first electronic component 210 and the second electronic component 220 by a welding method or a conductive adhesive. Further, the terminal 250 may be formed of a conductive paste.

The first electrode 212 and the second electrode 222 may be electrically connected with each other by the terminal 250 formed as described above. That is, the first electronic component 210 and the second electronic component 220 may be electrically connected with each other by the terminal 250.

Figure 11:
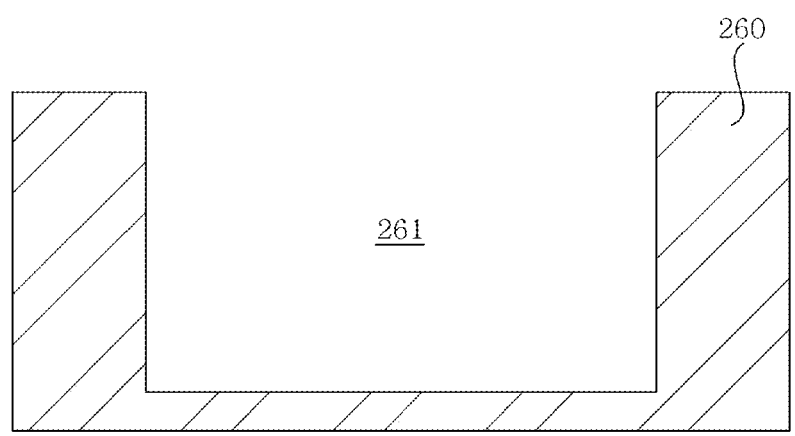

Referring to FIG. 11, a substrate 260 in which a cavity 261 is formed may be provided. The substrate 260 may be formed of an insulating material. As the insulating material, a thermosetting resin such as epoxy resin, a thermoplastic resin such as polyimide, and a resin in which reinforcing materials such as a glass fiber or a an inorganic filler are impregnated, for example, a prepreg may be used. Further, the insulating material may be a photocurable resin, and the like, but is not limited thereto. Further, the substrate 260 is not illustrated, but at least one layer of circuit layer may be formed in an insulating material.

The cavity 261 is an area drilled to embed the first electronic component 210 and the second electronic component 220 in the substrate 260. A method of forming the cavity 261 is not particularly limited. For example, the cavity 261 may be formed by a laser drill.

Figure 12:
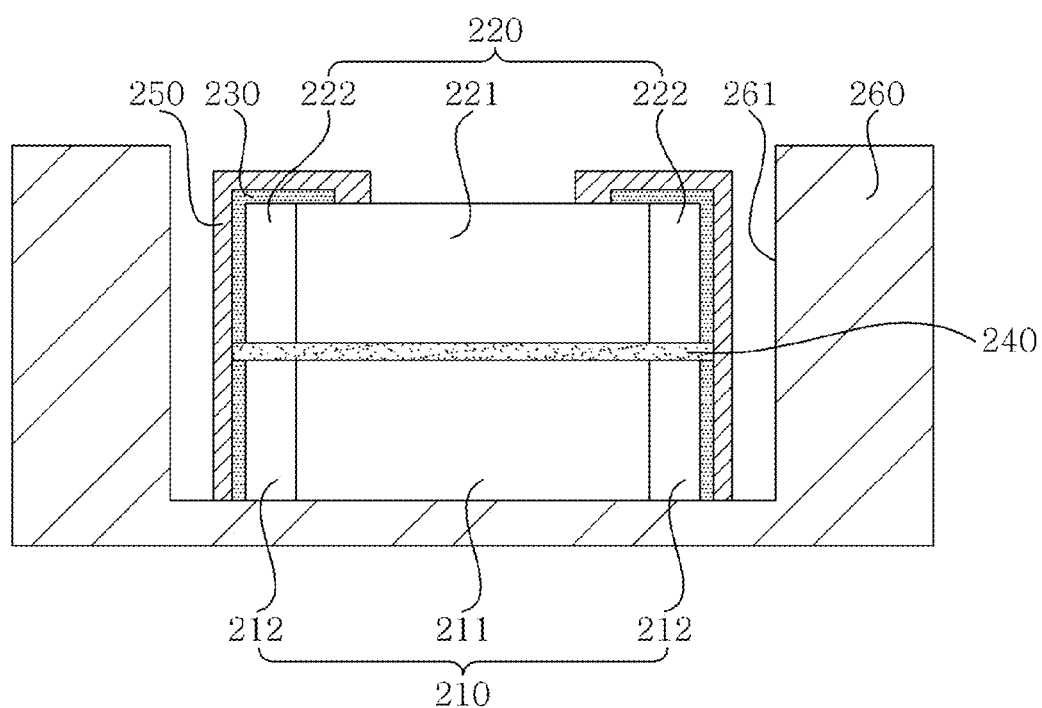

Referring to FIG. 12, the first electronic component 210 and the second electronic component 220 may be mounted on the substrate 260. The first electronic component 210 and the second electronic component 220 in which the terminal 250 is formed may be inserted into the cavity 261 of the substrate. In this case, although not illustrated, one surface of the cavity 261 contacting the first electronic component 210 may be applied with an adhesive.

Figure 13:
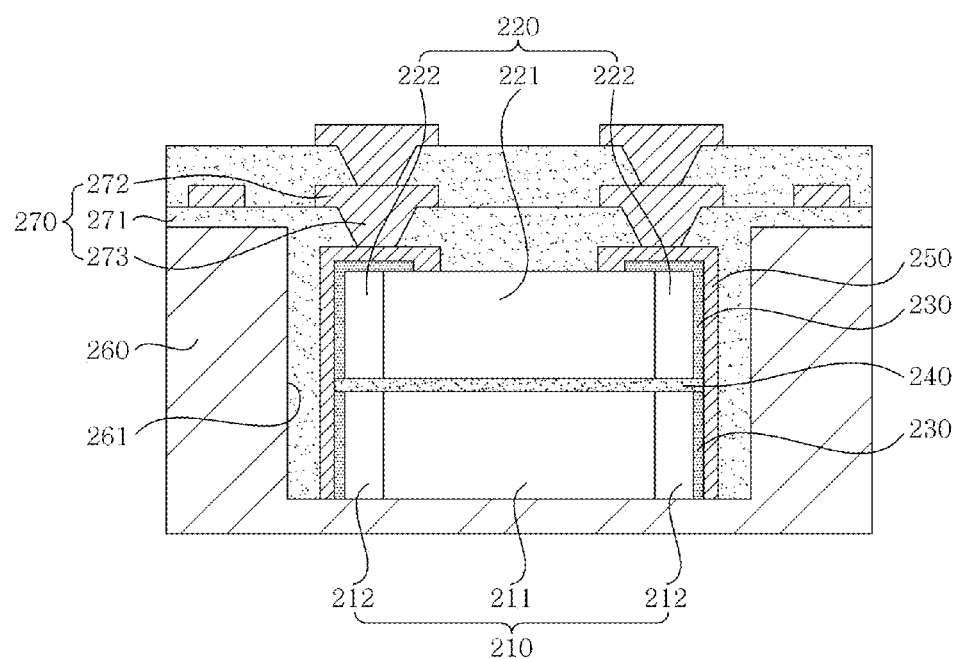

Referring to FIG. 13, the buildup layer 270 may be formed on the upper portion of the substrate 260 and the upper portion of the second electronic component 220. The substrate 260 in which the first electronic component 210 and the second electronic component 220 are embedded is formed with a buildup layer 270, thereby forming the printed circuit board 200 on which the plurality of electronic components 210 and 220. Here, the buildup layer 270 may include at least one layer of insulating layer 271 and circuit layer 272. The insulating layer 271 may be formed on the upper portion of the substrate 260 and may also be formed in a space between the electronic components 210 and 220 that are located in the cavity 261 and an inner wall of the cavity 261. The buildup layer 270 may be electrically connected with the first electronic component 210 and the second electronic component 220 that are embedded in the substrate 260. The circuit layer 272 is connected with the terminal 250, which is electrically connected with the first electrode 212 and the second electrode 222, by a via 273, such that the buildup layer 270 may be electrically connected with the first electronic component 210 and the second electronic component 220. In this case, the terminals 250 are formed over the upper surface of the second electrode 222 of the second electronic component 220 and the upper surface of the second body 221, such that the area in which the via 273 and the electronic components 210 and 220 can be connected with each other may be increased. That is, at the time of forming the via 273, an area that can be electrically connected with the electronic components 210 and 220 embedded in the substrate is increased, thereby improving the reliability of the electrical connection between the electronic components 210 and 220 and the buildup layer 270. Further, the via 273 is formed so as to be connected with the upper surface of the terminal 250 rather than with the second electrode 222, thereby preventing the second electrode 222 from being damaged due to the formation of the via 273.

According to the preferred embodiments of the present invention, the case in which the terminals are formed on the upper surface of the electronic component, the upper surface of the electrode, and the side of the electrode is described by way of example, but the contact structure between the terminal and the electronic component is not thereto. When the terminal is electrically connected with the electrode of the electronic component and is formed on the upper surface of the body, the structure may be easily changed by those skilled in the art.

According to the preferred embodiments of the present invention, the method of manufacturing a printed circuit board can electrically connect reliably between the buildup layer and electronic components by the terminal.

According to the preferred embodiments of the present invention, the method of manufacturing a printed circuit board can prevent the electrodes of electronic components from being damaged at the time of the electrical connection between the buildup layer and electronic components.

According to the preferred embodiments of the present invention, the method of manufacturing a printed circuit board can electrically connect the plurality of electronic components embedded therein.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A method of manufacturing a printed circuit board, comprising:
  forming an electronic component including an electrode that is formed on at least one side of a body;
  forming terminals on an upper portion of the electrode and an upper portion of the body;
  providing a substrate in which a cavity is formed;
  mounting the electronic component formed with the terminals in the cavity of the substrate; and
  forming a buildup layer on an upper portion of the substrate and an upper portion of the electronic component,
  wherein the forming of the terminals includes:
    preparing a plurality of terminals; and
    bonding the terminals to the upper portion of the electrode of the electronic component and the upper portion of the body of the electronic component.

2. The method as set forth in claim 1, further comprising:
  applying a conductive paste to an upper surface portion of the electrode and an upper surface portion of the body, prior to the forming of the terminals.

3. The method as set forth in claim 2, wherein the terminals are formed on an upper portion of the conductive paste.

4. The method as set forth in claim 1, wherein in the forming of the terminals, the terminals are formed of a conductive paste.

5. The method as set forth in claim 1, wherein in the forming of the terminals, the terminals are formed by a plating method.

6. The method as set forth in claim 1, wherein the terminals are bonded to the upper portion of the electrode and the upper portion of the body by a welding method or a conductive adhesive.

7. The method as set forth in claim 1, wherein in the forming of the buildup layer, the buildup layer includes at least one layer of insulating layer and circuit layer.

8. The method as set forth in claim 1, wherein the buildup layer further includes a via that is connected with an upper portion of the terminals.

9. A method of manufacturing a printed circuit board, comprising:
  forming a first electronic component formed with a first electrode on at least one side of a first body and a second electronic component formed with a second electrode on at least one side of a second body;
  mounting the second electronic component on an upper portion of the first electronic component;
  forming terminals on an upper portion of the second body, an upper portion of the second electrode, a side of the second electrode, and a side of the first electrode;
  providing a substrate in which a cavity is formed;
  mounting the first electronic component and the second electronic component formed with the terminals in the cavity of the substrate; and
  forming a buildup layer on an upper portion of the substrate and an upper portion of the second electronic component,
  wherein the forming of the terminals includes:
    preparing a plurality of; and
    bonding the terminals to the side of the first electrode, the upper portion of the second body, the upper portion of the second electrode, and the side of the second electrode.

10. The method as set forth in claim 9, wherein in the mounting of the second electronic component on the upper portion of the first electronic component, the first electronic component and the second electronic component are bonded to each other by an adhesive.

11. The method as set forth in claim 9, further comprising: prior to the mounting of the second electronic component on an upper portion of the first electronic component, applying a conductive paste to an to an upper surface of the second body, an upper surface of the second electrode, the side of the second electrode, and the side of the first electrode.

12. The method as set forth in claim 11, wherein the terminals are formed on an upper portion of the conductive paste.

13. The method as set forth in claim 9, wherein in the forming of the terminals, the terminals are formed of a conductive paste.

14. The method as set forth in claim 9, wherein in the forming of the terminals, the terminals are formed by a plating method.

15. The method as set forth in claim 9, wherein the terminals are bonded to the first electrode, the second body, and the second electrode by a welding method or a conductive adhesive.

16. The method as set forth in claim 9, wherein in the forming of the buildup layer, the buildup layer includes at least one layer of insulating layer and circuit layer.

17. The method as set forth in claim 9, wherein the buildup layer further includes a via that is connected with an upper portion of the terminals.

\* \* \* \* \*